United States Patent
Le Rhun

(10) Patent No.: US 11,865,580 B2
(45) Date of Patent: Jan. 9, 2024

(54) METHOD OF MANUFACTURING AN INTEGRATED CAPACITOR STRUCTURE USING A DONOR SUBSTRATE FOR TRANSFERRING LAYERS TO A RECEIVER SUBSTRATE

(71) Applicant: Commissariat A L'Energie Atomique et aux Energies Alternatives, Paris (FR)

(72) Inventor: Gwenael Le Rhun, Grenoble (FR)

(73) Assignee: Commissariat A L'Energie Atomique et aux Energies Alternatives, Paris (FR)

( * ) Notice: Subject to any disclaimer, the term of this patent is extended or adjusted under 35 U.S.C. 154(b) by 1104 days.

(21) Appl. No.: 16/445,274

(22) Filed: Jun. 19, 2019

(65) Prior Publication Data

US 2020/0001327 A1 Jan. 2, 2020

(30) Foreign Application Priority Data

Jun. 22, 2018 (FR) ...................................... 18 55592

(51) Int. Cl.
*B06B 1/06* (2006.01)
*H01L 49/02* (2006.01)
(Continued)

(52) U.S. Cl.
CPC ............ *B06B 1/0666* (2013.01); *H01L 28/55* (2013.01); *H10B 53/30* (2023.02); *H10N 15/15* (2023.02);
(Continued)

(58) Field of Classification Search
CPC . B06B 1/0666; H01L 27/11507; H01L 28/55; H01L 37/025; H01L 41/1876;
(Continued)

(56) References Cited

U.S. PATENT DOCUMENTS

2012/0319535 A1* 12/2012 Dausch ................... H01L 41/09
310/365
2013/0322663 A1 12/2013 Melcher et al.
(Continued)

FOREIGN PATENT DOCUMENTS

JP 2012203148 A * 10/2012

OTHER PUBLICATIONS

French Preliminary Search Report date Mar. 5, 2019 in French Application 1855592, filed on June 22, 2018 (with English Translation of Categories of Cited Documents).
(Continued)

*Primary Examiner* — Ermias T Woldegeorgis
(74) *Attorney, Agent, or Firm* — Oblon, McClelland, Maier & Neustadt, L.L.P.

(57) ABSTRACT

A method for producing an at least partially transparent device is provided, including producing, on a first substrate, first and second separation layers one against the other; producing, on the second separation layer, an at least partially transparent functional layer; making the functional layer integral with a second at least partially transparent substrate; forming a mechanical separation at an interface between the separation layers; removing the second separation layer; producing a first at least partially transparent electrode layer on the functional layer; where the materials of the stack are chosen such that the interface between the separation layers corresponds to that, among all the interfaces of the stack, having the lowest adherence force.

12 Claims, 4 Drawing Sheets

(51) Int. Cl.
*H10B 53/30* (2023.01)
*H10N 15/10* (2023.01)
*H10N 30/06* (2023.01)
*H10N 30/073* (2023.01)
*H10N 30/085* (2023.01)
*H10N 30/853* (2023.01)
*H10N 30/082* (2023.01)
*H10N 30/87* (2023.01)

(52) U.S. Cl.
CPC ........... *H10N 30/06* (2023.02); *H10N 30/073* (2023.02); *H10N 30/085* (2023.02); *H10N 30/8554* (2023.02); *H10N 30/082* (2023.02); *H10N 30/853* (2023.02); *H10N 30/8536* (2023.02); *H10N 30/8542* (2023.02); *H10N 30/8548* (2023.02); *H10N 30/8561* (2023.02); *H10N 30/878* (2023.02)

(58) Field of Classification Search
CPC ..... H01L 41/29; H01L 41/313; H01L 41/335; H01L 41/0478; H01L 41/187; H01L 41/1871; H01L 41/1873; H01L 41/1875; H01L 41/1878; H01L 41/332; B81C 2201/0195; B81C 1/0038; H10B 53/30; H10N 15/15; H10N 30/06; H10N 30/073; H10N 30/085; H10N 30/8554; H10N 30/082; H10N 30/853; H10N 30/8536; H10N 30/8542; H10N 30/8548; H10N 30/8561; H10N 30/878
See application file for complete search history.

(56) References Cited

U.S. PATENT DOCUMENTS

2018/0082989 A1    3/2018  Fong et al.
2020/0282424 A1*   9/2020  Oralkan ................. B81C 3/001

OTHER PUBLICATIONS

Sette, D., et al., "Transparent piezoelectric transducers for large area ultrasonic actuators", IEEE MEMS, 2017, pp. 793-796.
Mavrodineanu, R., "An Accurate Spectrophotometer for Measuring the Transmittance of Solid and Liquid Materials", Journal of the National Bureau of Standards—A. Physics and Chemistry, vol. 76A, No. 5, 1972, pp. 405-425.
Maszara, W. P., et al., "Bonding of Silicon Wafers for silicon-on-insulator", Journal of Applied Physics 64, 1988, 9 pages.

* cited by examiner

METHOD OF MANUFACTURING AN INTEGRATED CAPACITOR STRUCTURE USING A DONOR SUBSTRATE FOR TRANSFERRING LAYERS TO A RECEIVER SUBSTRATE

TECHNICAL FIELD AND PRIOR ART

The invention relates to a method for producing an at least partially transparent device integrating a capacitor type structure. The invention advantageously applies to the production of piezoelectric and/or pyroelectric and/or ferroelectric transducer devices, such as actuators and sensors, MIM (Metal-Insulator-Metal) or coplanar capacitors, or ferroelectric memories, at least partially transparent.

During the production of MEMS (micro electro mechanical system) and/or NEMS (nano electro mechanical system) components or microelectronic components, steps of deposition of layers, thin or thick, on a substrate are implemented. The substrate on which these layers are deposited may comprise semiconductor, such as for example silicon, or glass, or sapphire, or a polymer material.

For certain applications, for example optic or haptic, the devices produced, corresponding for example to capacitors, electromechanical transducers, etc., are advantageously transparent (totally or partially). It is then advisable to use an at least partially transparent substrate, for example made of glass or polymer and which may be of variable quality depending on the envisaged application, such as for example for the production of optical slabs for telephones or electronic tablets. The materials used for example for the production of electrodes or the functional materials of the devices or instead those forming elastic layers, are also at least partially transparent.

The technological methods conventionally used on silicon are not however always suited for such at least partially transparent substrates. For example, the deposition and/or annealing temperature of the materials to deposit on the substrate may not be compatible with the substrate. Thus, when the substrate used includes at least one polymer material, the deposition and/or annealing temperatures of the layers formed on such a substrate must not exceed around 150° C., at the risk of damaging it.

On the other hand, the choice of the at least partially transparent materials is quite restricted, especially since they have to be compatible with each other. This is the case for example when a functional material must be produced by growth on an electrode material. It is for example very complicated to grow a layer of AlN with good crystalline quality on an at least partially transparent electrode.

The document "Transparent piezoelectric transducers for large area ultrasonic actuators" of D. Sette et al., IEEE MEMS 2017, Las Vegas, NV, USA, 22-26 Jan. 2017, describes an example of producing a transparent piezoelectric transducer from a glass substrate. In this device, crystalline PZT (lead zirconate titanate) is deposited on a $SiO_2$ layer through a $TiO_2$ layer formed beforehand on the $SiO_2$ layer and making it possible to avoid the formation of fissures in the PZT. The PZT thereby produced does not however have texturing, that is to say of preferential crystallographic orientation, which is however necessary to optimise the piezoelectric properties of the PZT. In addition, the $TiO_2$ present between the PZT and the $SiO_2$ layer brings about a lowering of the light transmittance within the stack of the device. Finally, the structure of the device described in this document does not make it possible to have a buried electrode under the PZT layer, only interdigitated electrodes present on the surface of the PZT being possible.

To respond to a part of these problems, methods exist for transferring layers of materials from a donor substrate, on which one or more layers of materials to transfer are produced initially, onto a receiver substrate. Given that the steps of deposition and/or annealing necessary for the production of this or these layers are implemented before their transfer onto the receiver substrate, the material of the receiver substrate is not damaged by the temperatures brought into play during the deposition and/or the annealing of the materials on the donor substrate.

One of these transfer methods consists in forming a cleavage interface by ion implantation in the donor substrate. The donor substrate, on which the layer(s) to transfer have been produced, is next made integral with the receiver substrate. A separation of the two substrates is next carried out, at the cleavage interface formed in the donor substrate, by thermal treatment. Such a transfer method makes it possible however to only transfer layers of relatively low thickness, at the most around 1 micron thickness. In addition, the ion implantation can damage the layer(s) of materials which have to be crossed by the ion beam used. Moreover, a post-transfer surface treatment step must be implemented at the cleavage interface.

Another transfer method consists in forming the desired layer(s) on the donor substrate, to next transfer onto the receiver substrate the assembly formed of the desired layer(s) and the donor substrate, then to etch the donor substrate from its rear face (face opposite to that on which are found the layer(s) to transfer). The drawback of such a method is that the donor substrate is destroyed and that it can thus not be reused to produce another device. In addition, the etching of the donor substrate is a cumbersome step, long and expensive, and which requires providing a specific stoppage on the stack to transfer, for example by an etching stop layer and/or selective etching layer.

DESCRIPTION OF THE INVENTION

There thus exists a need to propose a method for producing an at least partially transparent device integrating a capacitor type structure and not having the drawbacks described above for the methods of the prior art.

To do so, a method is proposed for producing an at least partially transparent device, comprising at least:
producing, on one face of a first substrate, first and second separation layers arranged one against the other and such that the first separation layer is arranged between the first substrate and the second separation layer;
producing, on the second separation layer, at least one at least partially transparent functional layer;
making the functional layer integral with a second at least partially transparent substrate, forming a stack of different materials;
mechanical separation at an interface between the first and second separation layers, such that the first separation layer remains integral with the first substrate and that the second separation layer remains integral with the functional layer;
removal of the second separation layer;
producing at least one first at least partially transparent electrode layer on the functional layer;
in which the materials of the stack are chosen such that the interface between the first and second separation layers corresponds to that, among all the interfaces of the stack, having the lowest adherence force, and in which:

one of the first and second separation layers comprises at least SiO$_2$ and/or silicon nitride (such as SiN and/or Si$_3$N$_4$), and the other of the first and second separation layers comprises at least one noble metal, and/or the method comprises, between the step of producing the first and second separation layers and the making integral step, the implementation of at least one step reducing an initial adherence force of the interface between the first and second separation layers.

In this method, the interface at which the mechanical separation is carried out may be defined beforehand by a judicious choice of the materials of the first and second separation layers bringing about naturally a low adherence force at this interface. By using on one side a noble metal and on the other SiO$_2$ and/or silicon nitride to form the first and second separation layers, a low adherence force is obtained at the interface of these two separation layers, without having to implement a specific step. Thus, after having made the two substrates integral with each other, the mechanical separation carried out at the interface between the first and second separation layers does not degrade the other layers because it is the interface between the first and second separation layers which has the lowest adherence force among all the interfaces of the stack obtained by making the first and second substrates integral with each other.

In an alternative or as a complement to the production of the first and second separation layers from a noble metal and SiO$_2$ and/or silicon nitride, the adherence force at the interface between the first and second separation layers may be reduced by implementing a specific step, such as for example the formation of cavities at this interface.

The metal used to form one of the first and second separation layers may correspond to an oxidation resistant metal.

The separation layer comprising SiO$_2$ and/or silicon nitride may correspond to a SiO$_2$ or silicon nitride layer, or to a stack of SiO$_2$ and silicon nitride.

This method also has the advantage of being compatible with any thickness of layer(s), that is to say one or more thin and/or thick layers, intended to form part of the device, notably the functional layer and optionally an electrode layer intended to form a buried electrode of the device.

In addition, at the end of the mechanical separation at the interface between the first and second separation layers, the first substrate is not destroyed and may be reused, for example to produce a new device.

This method also has the advantage of not exposing the second at least partially transparent substrate to high temperatures for the production of the different layers of materials of the device, and does not necessitate the implementation of an etching of the first substrate, which is very restricting, or an ion implantation, which can damage certain layers of materials of the device.

This method does not have either the constraints encountered when the device is produced without layer transfer. This method does not limit the choice of the at least partially transparent materials that can be used, makes it possible to obtain a functional material of good quality, of good transmittance and the device may comprise an electrode buried under the functional layer.

The device may advantageously correspond to an actuator and/or a sensor of piezoelectric type, a pyroelectric sensor, a vibratory energy recovery device, a ferroelectric memory, or instead a MIM or coplanar capacitor.

Throughout the document, the term "on" is used without distinction of the orientation in space of the element to which this term relates. For example, in the characteristic "on one face of the first substrate", this face of the first substrate is not necessarily oriented upwards but may correspond to a face oriented along any direction. Moreover, the arrangement of a first element on a second element should be understood as being able to correspond to the arrangement of the first element directly against the second element, without any intermediate element between the first and second elements, or instead being able to correspond to the arrangement of the first element on the second element with one or more intermediate elements arranged between the first and second elements.

The expression "all the interfaces of the stack" designates all the interfaces formed between two successive layers (arranged one directly against the other) of the stack.

Throughout the document, an at least partially transparent element designates an element having, for wavelengths between around 350 nm and 1 µm, a transmission, or transmittance, rate greater than or equal to around 60%, that is to say which can be crossed by at least 60% of light beams of wavelength comprised in the range [350 nm; 1 µm]. The transmittance may be measured as described for example in the document R. Mavrodineanu, "An Accurate Spectrophotometer for Measuring the Transmittance of Solid and Liquid Materials", Journal of Research of the National Bureau of Standards—A. Physics and Chemistry, Vol. 76A, No 5, September-October 1972.

A transducer device designates a device capable of converting a first physical quantity into a second physical quantity of different nature to that of the first physical quantity (for example conversion of a mechanical force into an electrical signal, or vice versa).

The noble metal corresponds to one or more of the following materials: platinum (Pt), gold (Au), silver (Ag), rhodium (Rh), osmium (Os), palladium (Pd), ruthenium (Ru), iridium (Ir).

When the noble metal is intended to be exposed to high thermal budgets, for example up to a temperature equal to around 850° C., this noble metal advantageously comprises platinum and/or palladium. When the noble metal is intended to be exposed to less high temperatures, such as for example temperatures less than or equal to around 400° C., other noble metals (Au, Ag, Rh, Os, Ru, Ir) may be used to form this layer of noble metal.

The adherence force of the interface between the first and second separation layers may be less than or equal to around 1.5 J/m$^2$, or preferably less than or equal to around 1 J/m$^2$. As an example, the adherence force between the first and second separation layers with one including SiO$_2$ and the other platinum is equal to around 1 J/m$^2$.

The adherence force between two layers of materials may be measured by the so-called blade insertion method described for example in the document W. P. Mazsara et al., "Bonding of silicon wafers for silicon-on-insulator", Journal of Applied Physics 64, p. 4943, 1988).

The device produced comprises a capacitor type structure, the functional layer being able to be intended to be crossed by a current circulating between at least two electrodes formed from the first electrode layer (with for example interdigitated electrodes produced on one face of the functional layer) or from the first electrode layer and a second electrode layer, with the functional layer arranged between the first and second electrode layers.

The expression "functional layer" designates a layer of material capable of fulfilling, with the electrode layer(s), the function of the device produced. For example, when the device is a transducer, the functional layer is capable of converting a first physical quantity into a second physical quantity of different nature from that of the first physical quantity. When the device is a capacitor, the functional layer corresponds to the dielectric insulation layer of the capacitor. When the device is a ferroelectric memory, the functional layer corresponds to the layer of ferroelectric material fulfilling the memorisation function.

The functional layer may be in direct contact with the first electrode layer.

The first substrate may comprise semiconductor, for example silicon.

The step of making integral may be implemented:
through at least one at least partially transparent adhesive layer produced on the functional layer and/or on the second substrate, or
by direct bonding, or molecular bonding, between a first at least partially transparent bonding layer produced on the functional layer, and a second at least partially transparent bonding layer produced on the second substrate.

When the making integral step is implemented through the adhesive layer produced on the functional layer and/or on the second substrate, it is possible to have one or more other layers of materials present between the adhesive layer and the functional layer or between the adhesive layer and the second substrate.

When the making integral step is implemented by direct bonding, or molecular bonding, between the first and second bonding layers, it is possible to have one or more other layers of materials present between the first bonding layer and the functional layer and/or between the second bonding layer and the second substrate.

The adhesive layer may comprise a polymer glue, or the first and second bonding layers may comprise $SiO_2$.

The method is particularly advantageous when the pyroelectric and/or piezoelectric and/or ferroelectric and/or dielectric material comprises lead, such as for example when this material corresponds to PZT (lead zirconate titanium) or a material of the same family as PZT, because it makes it possible in this case to be free of the constraints linked to the integration of this material comprising lead, such as the thermal budget necessary for its deposition (which is not compatible with a glass substrate or a substrate including a polymer). For example, when the pyroelectric and/or piezoelectric and/or ferroelectric and/or dielectric material corresponds to a material with crystalline perovskite structure such as for example PZT, the crystallisation/densification of this material necessitates reaching temperatures greater than around 500° C., or even 700° C., which is not compatible with an at least partially transparent substrate such as a glass substrate or instead a polymer substrate.

Similarly, when the material of the functional layer comprises AlN, this method is advantageous because it avoids the exposure of the second substrate to the recrystallisation temperatures of AlN (of the order of 300° C.).

The method may be such that:
the pyroelectric and/or piezoelectric and/or ferroelectric and/or dielectric material comprises lead, and may correspond to PZT;
said one of the first and second separation layers comprises $SiO_2$;
said at least one step reducing the initial adherence force of the interface between the first and second separation layers comprises the implementation of at least one thermal treatment forming, at the interface between the first and second separation layers, an alloy of lead and $SiO_2$ in liquid phase, then a cooling forming cavities at the interface between the first and second separation layers.

Such cavities contribute, alone or as a complement to the materials chosen to form the first and second separation layers, to obtaining the low adherence force at the interface between the first and second separation layers.

The method may further comprise, between the production of the functional layer and making the functional layer integral with the second substrate, the production of at least one second at least partially transparent electrode layer on the functional layer, and, during the making integral step, the second electrode layer may be arranged between the second substrate and the functional layer. The device obtained at the end of the method thus has a buried electrode formed by this second electrode layer and may have a structure of the type of that of a MIM capacitor, that is to say have the functional layer arranged between the first and second electrode layers. The production of such a device with this method has the advantage of not having to carry out the growth of the material of the functional layer on one of the electrode layers because the quality of an electrode layer on which a functional material is produced is then critical for the quality of the functional material thereby obtained.

The functional layer may be arranged between and in direct contact with the first and second electrode layers.

In an alternative, the method may further comprise, after the production of the first electrode layer, an etching of the first electrode layer according to an interdigitated comb pattern and forming the electrodes of the device. The device obtained has in this case a structure of the type of that of a coplanar capacitor with its electrodes formed on a single face of the functional layer.

The method may further comprise, after the making integral step, the production of at least one cavity in the second substrate, through a face opposite to that on which the functional layer is made integral. Such a cavity may serve to form a membrane, for example when the device is an electromechanical transducer, notably piezoelectric of PMUT (Piezoelectric Micromachined Ultrasonic Transducer) type or an energy recovery device.

The second substrate may comprise at least one polymer material, and the making integral step may be implemented at a temperature less than or equal to around 150° C. As non-limiting examples, a making integral at a temperature less than around 150° C. may correspond to a bonding through a layer of glue including a polymer material, or instead a oxide-oxide direct bonding.

An at least partially transparent device is also proposed comprising at least:
an at least partially transparent substrate;
first and second at least partially transparent electrode layers arranged on the side of a first face of the substrate and each including at least one electrically conductive material;
an at least partially transparent functional layer, arranged between and in direct contact with the first and second electrode layers.

The device may further comprise at least one cavity crossing at least one part of the substrate from a second face of the substrate opposite to the first face.

BRIEF DESCRIPTION OF THE DRAWINGS

The present invention will be better understood on reading the description of exemplary embodiments given for only illustrative purposes and in no way limiting while referring to the appended drawings in which.

Identical, similar or equivalent parts of the different figures described hereafter bear the same numerical references so as to make it easier to go from one figure to the next.

The different parts shown in the figures are not necessarily according to a uniform scale, in order to make the figures more legible.

The different possibilities (alternatives and embodiments) should be understood as not being mutually exclusive and may be combined together.

DETAILED DESCRIPTION OF PARTICULAR EMBODIMENTS

Reference is firstly made to FIGS. 1A to 1D which show the steps of a method for producing an at least partially transparent device 100 according to a first embodiment.

Figure 1A:
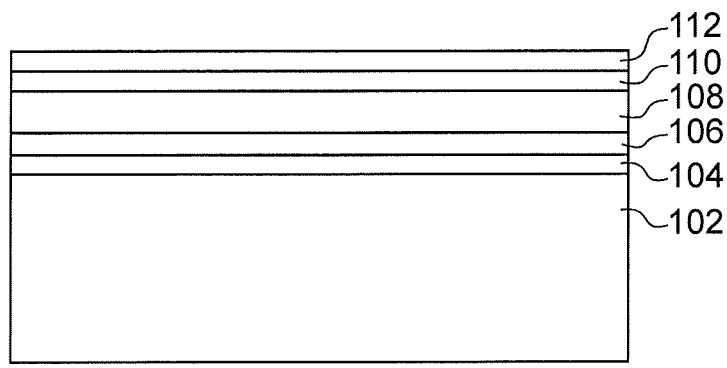
FIGS. 1A to 1D show the steps of a method for producing an at least partially transparent device according to a first embodiment.

As shown in FIG. 1A, a first substrate 102, also called donor substrate, is used to produce at least one part of the layers of the device 100. The first substrate 102 here corresponds to a semiconductor substrate, including for example silicon, and of which the thickness is for example between around 100 μm and 1 mm.

A low adherence force interface is firstly formed on the first substrate 102. In this first embodiment, this interface is formed thanks to a first separation layer 104 here including at least one noble metal and a second separation layer 106 including at least $SiO_2$ and/or silicon nitride such as SiN and/or $Si_3N_4$. The low adherence force interface corresponds to the interface between these two separation layers 104, 106, and is obtained thanks to the nature of the materials of the separation layers 104, 106 which only adhere weakly to each other.

The noble metal of the first separation layer 104 comprises at least one of the following elements: platinum, gold, silver, rhodium, osmium, palladium, ruthenium, iridium. The thickness of the first separation layer 104 is for example between around 1 nm and 200 nm. The material of the second separation layer 106 may advantageously correspond to $SiO_2$. The thickness of the second separation layer 106 is for example between around 1 nm and 20 m. The first separation layer 104 that comprises the noble metal may be formed by deposition, for example by PVD (physical vapour deposition). The second separation layer 106 which comprises $SiO_2$ and/or silicon nitride may also be formed by PVD.

An at least partially transparent functional layer 108 is produced, for example by cathodic sputtering, on the second separation layer 106. In the first embodiment described here, the device 100 corresponds to an at least partially transparent piezoelectric transducing device, and the layer 108 thus comprises an at least partially transparent piezoelectric material, such as for example AlN, optionally doped (for example with Sc) to optimise the piezoelectric properties thereof, or ZnO. The thickness of the layer 108 is for example between around 1 nm and 100 μm. Moreover, due to the fact that the material of the layer 108 is formed on the second separation layer 106, this material of the layer 108 has an optimal texturing which will result in fine in good transducing performances of the device 100.

In an alternative, the layer 108 may comprise PZT or a material of the same family as PZT, which can also be doped for example by La, Nb, Mn, etc., or instead PMN-PT $((1-x)Pb(Mg_{1/3}Nb_{2/3})O_3\text{-}xPbTiO_3)$, KNN $((K,Na)NbO_3)$, NBT-BT $((Na_{0.5}Bi_{0.5})TiO_3\text{—}BaTiO_3)$, $BaTiO_3$, or any other at least partially transparent transducing material. The material of the layer 108 is for example deposited by sol-gel process or by cathodic sputtering. In this case, the first separation layer 104 preferably comprises $SiO_2$ and/or silicon nitride, and the second separation layer 106 preferably comprises the noble metal in order that the transducing material is formed on the noble metal, conferring an optimal texture (preferential crystallographic orientation) on the transducing material.

An at least partially transparent electrode layer 110 is formed, for example by deposition, on the layer 108. This electrode layer 110 is intended to form one of the electrodes of the device 100. This layer 110 comprises an electrically conductive material, for example a metal oxide, and at least partially transparent, such as for example ITO (indium tin oxide), ZNO doped with Ga (also called GZO), or ZNO doped with Al (also called AZO) or any other at least partially transparent conductive material such as for example a very thin metal (thickness for example between around 1 nm and 10 nm). The thickness of the layer 110 is for example between around 1 nm and 200 nm.

A first bonding layer 112 is next produced, for example by deposition, on the electrode layer 110. This first bonding layer 112 is intended to serve for the implementation of a direct bonding, or molecular bonding, with a second bonding layer enabling the transfer of the layers 108 and 110 onto a second at least partially transparent substrate intended to form the support of the device 100. The first bonding layer 112 has properties suited to the implementation of a direct bonding: very low roughness, suitable material, etc. This first bonding layer 112 comprises for example $SiO_2$, and has a thickness for example between around 1 nm and 20 μm.

Figure 1B:
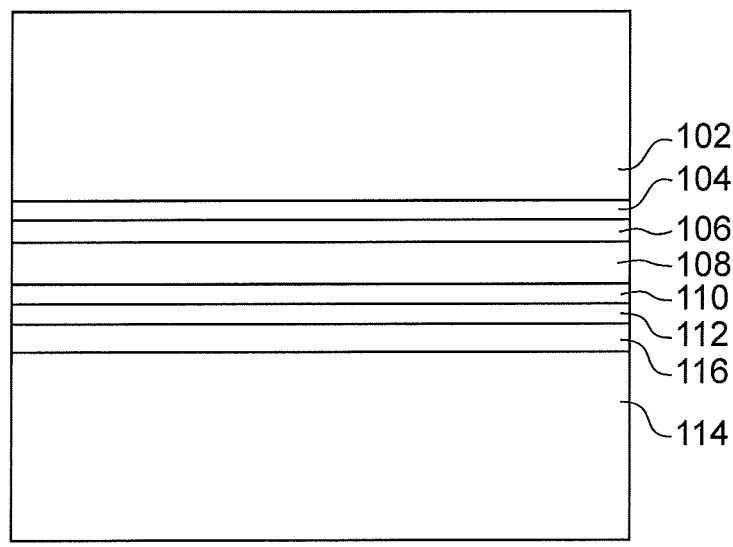
Figure 1C:
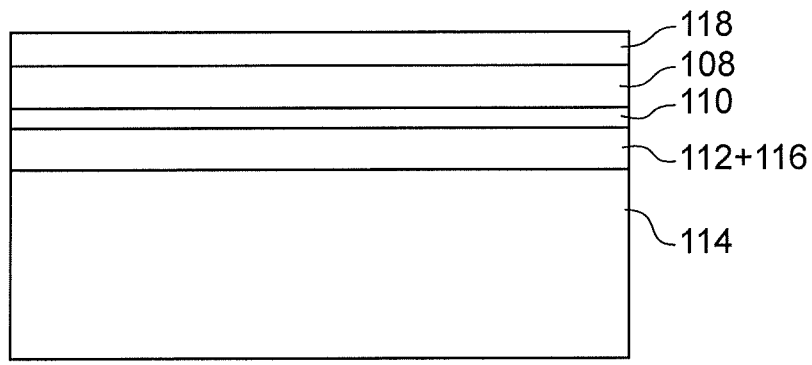

As shown in FIG. 1B, the first substrate 102 and the layers 104, 106, 108, 110 and 112 formed on the first substrate 102 are transferred onto a second at least partially transparent substrate 114 and on which is formed beforehand a second bonding layer 116 suitable for the implementation of a direct bonding with the first bonding layer 112. The second bonding layer 116 comprises for example $SiO_2$ and is formed by PVD.

The second substrate 114 comprises at least one partially transparent material corresponding for example to glass, or instead a polymer material. In the case of a second supple/flexible substrate 114, this may be arranged on a rigid support during the transfer of the first substrate 102 and layers 104-112 thereon. The thickness of the second substrate 114 is for example equal to several hundreds of microns. When the second substrate 114 corresponds to a substrate made of polymer material, its thickness is for example between around 1 μm and 1 mm.

Within the stack thereby obtained, the low adherence force interface formed between the separation layers 104, 106 corresponds, among all the interfaces of the stack, to that which has the lowest adherence force between two successive layers of the stack.

A mechanical separation is next carried out at this low adherence force interface between the separation layers 104, 106. This mechanical separation is for example carried out by introducing a blade between the two wafers. At the end of this mechanical separation, the stack remaining conserved comprises the second substrate 114 on which the layers 108 and 110 are made integral through the bonding layers 112+116. The remaining first substrate 102 may be reused later, for example for the production of another device 100. The material and the thickness of the bonding layers 112, 116 are chosen such that the assembly of these two bonding layers forms together an at least partially transparent element.

The second separation layer 106 is removed after the separation step, for example by dry RIE (reactive ion etching). Another at least partially transparent electrode layer 118, for example similar to the electrode layer 110, is next produced on the layer 108 (see FIG. 1C).

Figure 1D:
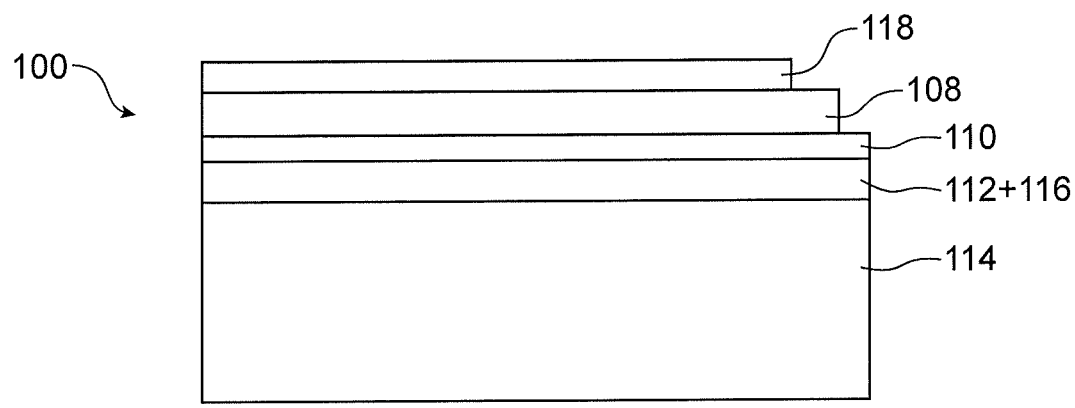

The device 100 is next completed by structuring, by the implementation of lithography and etching steps, of the layers 110, 108 and 118 according to the pattern desired for the device 100. In FIG. 1D, the layers 108 and 118 are etched in order that parts of each of these layers are electrically accessible, that is to say not covered by the other layers.

In the first embodiment described previously, the first separation layer 104 comprises the noble metal and the second separation layer 106 comprises $SiO_2$ and/or silicon nitride. According to an alternative, it is possible that the first separation layer 104 comprises $SiO_2$ and/or silicon nitride, and that the second separation layer 106 comprises the noble metal. In this case, the first separation layer 104, when it comprises $SiO_2$, is for example produced by thermal oxidation of the upper face of the first substrate 102 when this first substrate 102 comprises silicon.

In the first embodiment described previously, the making integral of the first substrate 102 and the layers 104-110 with the second substrate 114 is carried out by the implementation of a direct bonding between the two bonding layers 112, 116 formed beforehand on each of the parts of the device 100 to be made integral. In an alternative, this making integral may be obtained by forming on the first electrode layer 110 and/or on the second substrate 114 at least one at least partially transparent adhesive layer, corresponding for example to a layer of polymer glue of thickness for example between around 1 μm and 100 μm.

Other bonding means may also be envisaged to achieve making the first substrate 102 and the layers 104-110 integral with the second substrate 114, from the moment that this making integral forms an at least partially transparent interface and having an adherence force greater than that formed between the separation layers 104, 106.

In the first embodiment described above, the device 100 corresponds to a piezoelectric transducer device and the layer 108 thus comprises an at least partially transparent piezoelectric material. In an alternative, the device 100 may be configured to carry out a different transduction from a piezoelectric transduction. The nature of the material used for the layer 108 is in this case suited to the type of transduction intended to be carried out by the device 100. It is for example possible that the material of the layer 108 is a pyroelectric and/or piezoelectric and/or ferroelectric and/or dielectric material. According to another alternative, the device 100 may correspond to a component other than a transducer device, such as for example a capacitor or a memory. The nature of the material of the functional layer 108 is in all cases suited to the function that has to be fulfilled by the functional layer 108 (isolation, memorisation, transduction, etc.).

In the first embodiment described previously, the low adherence force interface is formed thanks to the intrinsic properties of the materials of the separation layers 104, 106, due to the fact that $SiO_2$ and silicon nitride adhere poorly to noble metals. In an alternative, it is possible that the low adherence force of the interface between the donor substrate (first substrate 102) and the layers 108, 110 to transfer onto the receiver substrate (second substrate 114) is obtained thanks to the implementation of at least one step degrading the adherence properties of this interface and reducing the adherence force at this interface between the materials of the first and second separation layers 104, 106. As an example, during the deposition of a layer 108 comprising PZT on the second separation layer 106, it is possible to implement a thermal treatment making atoms of lead coming from the PZT diffuse from the layer 108 into the $SiO_2$ of one of the separation layers 104, 106. With such a thermal treatment, for example implemented at a temperature greater than or equal to around 700° C., a $SiO_2$+Pb mixture in liquid phase forms at the interface between the first and second separation layers 104, 106. When the temperature drops, cavities are then created at this interface, in the layer formed of the $SiO_2$ and lead mixture. These cavities reduce the adherence between the separation layers 104, 106. The mechanical separation next carried out is similar to that described previously.

This degradation, or reduction, of the adherence force of the interface between the separation layers 104, 106 may thus be advantageously carried out when the intrinsic properties of the materials used for these separation layers 104, 106 do not bring about, without additional intervention, the formation of a low adherence force interface.

Figure 2:
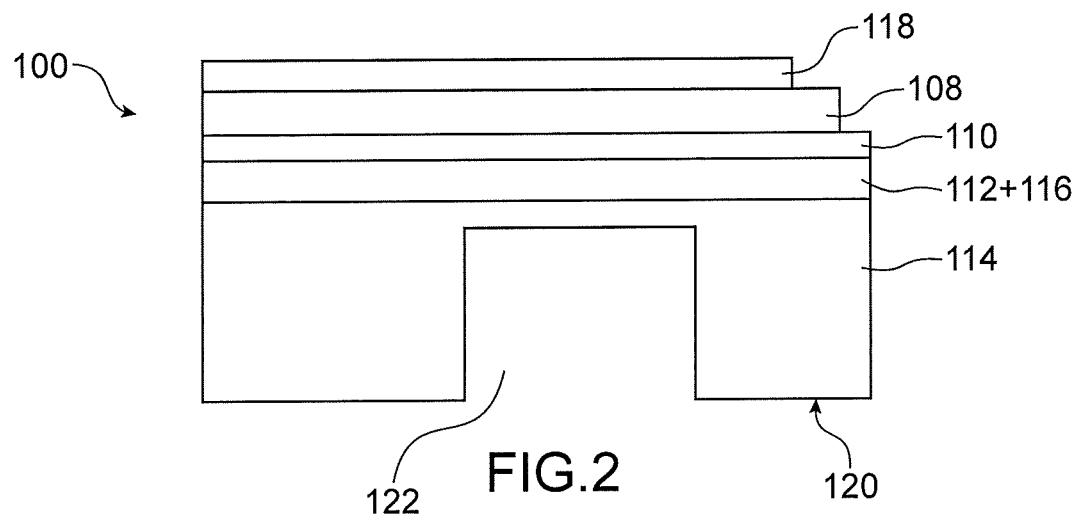
FIG. 2 shows an at least partially transparent device obtained by the implementation of a production method according to an alternative of the first embodiment.

In the first embodiment described previously, the second at least partially transparent substrate 114 corresponds to a layer of non-structured material. In an alternative, it is possible that one or more cavities are produced by etching through at least one part of the thickness of the second substrate 114, from a rear face 120 of this second substrate 114, in order to confer a certain degree of mobility on the layers 108, 110, 118. FIG. 2 shows the device 100 according to this alternative embodiment, the reference 122 designating a cavity formed through a part of the thickness of the second substrate 114.

A method for producing the device 100 according to a second embodiment is described below in relation with FIGS. 3A to 3D.

Figure 3A:
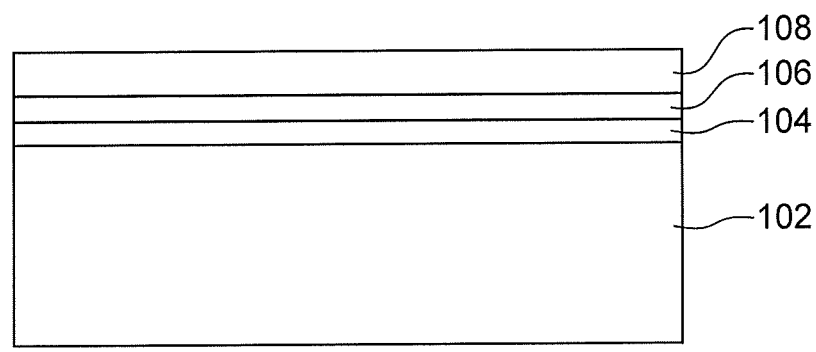
FIGS. 3A to 3D show the steps of a method for producing an at least partially transparent device according to a second embodiment.

As for the first embodiment, the layers 104, 106 and 108 are produced on the first substrate 102 (FIG. 3A). However, unlike the first embodiment in which the electrode layer 110 is formed on the layer 108, no electrode layer is here formed on the layer 108. In addition, in this second embodiment, the bonding between the substrates 102, 114 will be achieved by an adhesive layer. Thus, the bonding layer 112 is not produced at the top of the stack formed on the first substrate 102.

Figure 3B:
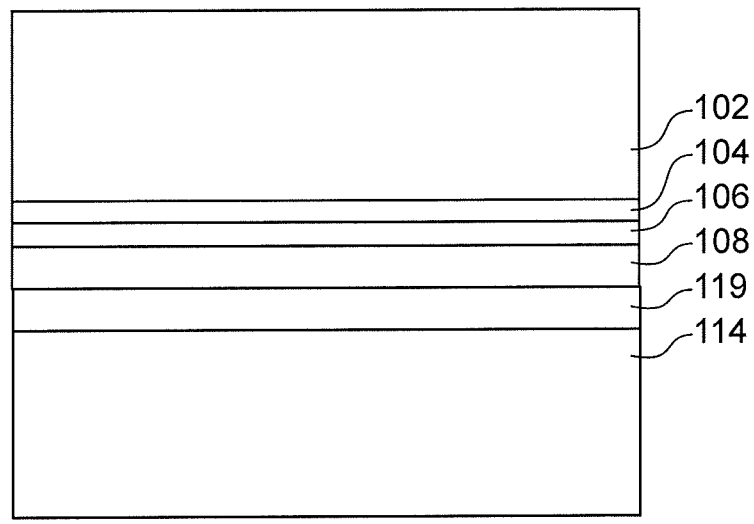

The substrates 102, 114 are made integral with each other through an adhesive layer 119 formed on the second substrate 114 and with which the layer 108 is made integral (FIG. 3B). The adhesive layer 119 comprises for example a polymer glue.

In an alternative or as a complement, the adhesive layer may be produced on the layer 108.

Figure 3C:
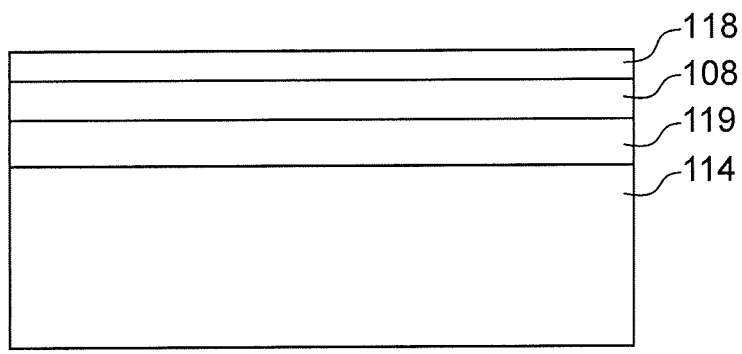

A mechanical separation is next carried out between the separation layers 104, 106, then the second separation layer 106 is removed and the electrode layer 118 is produced on the layer 108 (FIG. 3C).

Figure 3D:
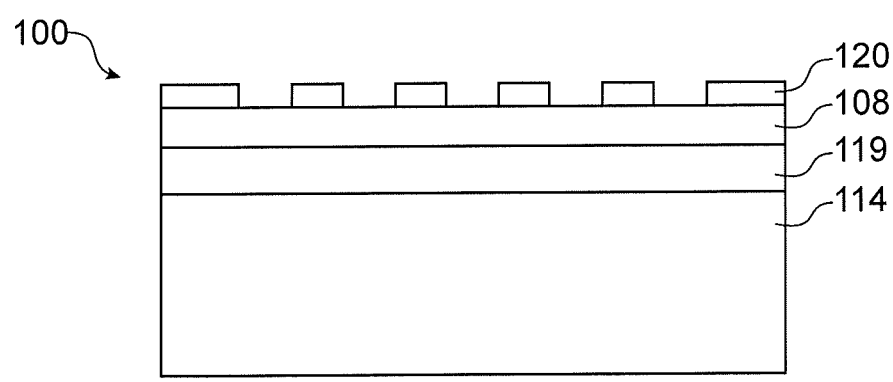

The device 100 according to this second embodiment is completed by etching the electrode layer 118 in order that the remaining portions 120 of this layer 118 form, on a single face of the layer 108, the electrodes of the device 100 (FIG. 3D). These electrodes 120 form for example interdigitated combs.

Figure 4:
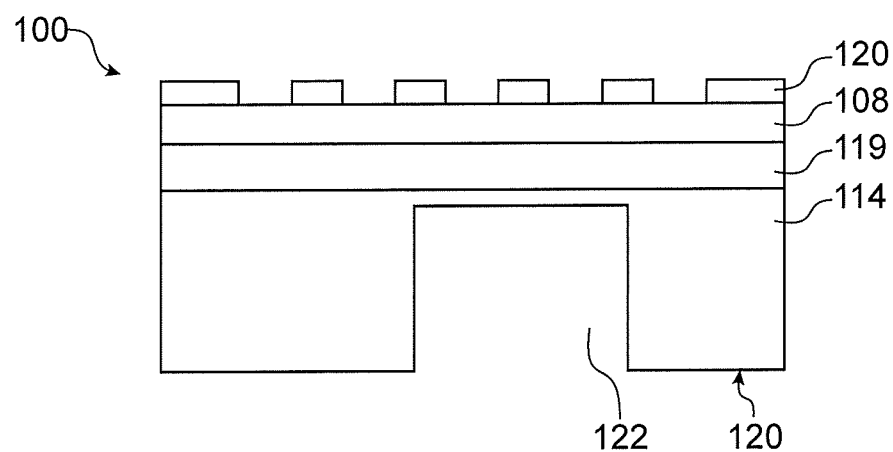
FIG. 4 shows an at least partially transparent device obtained by the implementation of a production method according to an alternative of the second embodiment.

FIG. 4 shows the device 100 according to an alternative of the second embodiment, including the cavity 122 formed through at least one part of the thickness of the second substrate 114.

The different exemplary embodiments and the different alternative embodiments described may apply for each of the embodiments.

The invention claimed is:

1. A method for forming an at least partially transparent device, comprising:
forming, on one face of a first substrate, a first separation layer and a second separation layer arranged one against the other and such that the first separation layer is arranged between the first substrate and the second separation layer;
forming, on the second separation layer, at least one at least partially transparent functional layer;
making the functional layer integral with a second at least partially transparent substrate, which forms a stack of different materials constituted by a first material of the first separation layer, a second material of the second separation layer, and a third material of the functional layer, each of the first, the second, and the third materials being different materials;
forming a mechanical separation at an interface between the first separation layer and the second separation layer, such that the first separation layer remains in contact with the one face of the first substrate and that the second separation layer remains integral with the functional layer;
removing the second separation layer; and
forming at least one first at least partially transparent electrode layer on the functional layer,
wherein the different materials of the stack are chosen such that the interface between the first separation layer and the second separation layer has a lowest adherence force among all interfaces of the stack, and
wherein one of the first separation layer and the second separation layer comprises $SiO_2$ and/or silicon nitride, and the other of the first separation layer and the second separation layer comprises at least one noble metal.

2. The method according to claim 1, wherein the step of making the functional layer integral is implemented:
through at least one at least partially transparent adhesive layer produced on the functional layer and/or on the second substrate, or
by direct bonding between a first at least partially transparent bonding layer produced on the functional layer, and a second at least partially transparent bonding layer produced on the second substrate.

3. The method according to claim 2, wherein:
the adhesive layer comprises a polymer glue, or
the first at least partially transparent bonding layer and the second at least partially transparent bonding layer comprise $SiO_2$.

4. The method according to claim 1, wherein the functional layer comprises at least one pyroelectric material and/or piezoelectric material and/or ferroelectric material and/or dielectric material.

5. The method according to claim 4, wherein:
the pyroelectric material and/or the piezoelectric material and/or the ferroelectric material and/or the dielectric material comprises lead,
the one of the first separation layer and the second separation layer comprises $SiO_2$, and
the method further comprises a step of reducing the initial adherence force of the interface between the first separation layer and the second separation layer comprising implementing at least one thermal treatment forming, at the interface between the first separation layer and the second separation layer, an alloy of lead and $SiO_2$ in a liquid phase, then a cooling forming cavities at the interface between the first separation layer and the second separation layer.

6. The method according to claim 1, wherein the noble metal comprises platinum.

7. The method according to claim 1, wherein:
the first separation layer comprises the noble metal, the second separation layer comprises $SiO_2$ and/or silicon nitride, and the functional layer comprises MN, or
the first separation layer comprises $SiO_2$ and/or silicon nitride, the second separation layer comprises the noble metal, and the functional layer comprises PLT.

8. The method according to claim 1,
further comprising, between the step of forming the functional layer and the step of making the functional layer integral with the second substrate, forming at least one second at least partially transparent electrode layer on the functional layer, and
wherein, during the step of making the functional layer integral with the second substrate, the second electrode layer is arranged between the second substrate and the functional layer.

9. The method according to claim 1, further comprising, after the step of forming the first electrode layer, etching the first electrode layer according to an interdigitated comb pattern and forming the electrodes of the device.

10. The method according to claim 1, further comprising, after the step of making the functional layer integral with the second substrate, forming at least one cavity in the second substrate, through a face opposite to that on which the functional layer is made integral.

11. The method according to claim 1,
wherein the second substrate comprises at least one polymer material, and
wherein the step of making the functional layer integral with the second substrate is implemented at a temperature less than or equal to around 150° C.

12. A method for forming an at least partially transparent device, comprising:
forming, on one face of a first substrate, a first separation layer and a second separation layer arranged one against the other and such that the first separation layer is arranged between the first substrate and the second separation layer;
forming, on the second separation layer, at least one at least partially transparent functional layer;
making the functional layer integral with a second at least partially transparent substrate, which forms a stack of different materials constituted by a first material of the first separation layer, a second material of the second separation layer, and a third material of the functional layer, each of the first, the second, and the third materials being different materials;

forming a mechanical separation at an interface between the first separation layer and the second separation layer, such that the first separation layer remains in contact with the one face of the first substrate and that the second separation layer remains integral with the functional layer;

removing the second separation layer; and forming at least one first at least partially transparent electrode layer on the functional layer, wherein the different materials of the stack are chosen such that the interface between the first separation layer and the second separation layer has a lowest adherence force among all interfaces of the stack, and wherein the method further comprises, between the step of forming the first separation layer and the second separation layer and the step of making the functional layer integral, implementing at least one step of reducing an initial adherence force of the interface between the first separation layer and the second separation layer.

\* \* \* \* \*